United States Patent [19]

Ushida et al.

[11] Patent Number: 4,940,681
[45] Date of Patent: Jul. 10, 1990

[54] FERROELECTRIC CERAMIC MATERIAL

[75] Inventors: Yoshihisa Ushida; Nobuki Hirai; Hiroshi Mase, all of Ichihara, Japan

[73] Assignee: Mitsui Petrochemical Industries, Ltd., Tokyo, Japan

[21] Appl. No.: 356,135

[22] Filed: May 24, 1989

[30] Foreign Application Priority Data

May 27, 1988 [JP] Japan ................................. 63-129797
May 27, 1988 [JP] Japan ................................. 63-129798

[51] Int. Cl.$^5$ ...................... C04B 35/46; C04B 35/48; C04B 35/49
[52] U.S. Cl. ..................................... 501/134; 252/62.9
[58] Field of Search ........................ 252/62.9; 501/134

[56] References Cited

U.S. PATENT DOCUMENTS 3,268,453  8/1966  Ouchi et al. ....................... 252/62.9
3,956,150  5/1976  Ouchi et al. ....................... 252/62.9

Primary Examiner—William R. Dixon, Jr.
Assistant Examiner—Alan A. Wright
Attorney, Agent, or Firm—Birch, Stewart, Kolasch & Birch

[57] ABSTRACT

The present invention relates to a ferroelectric ceramic material which is a Perovskite solid said solution comprising a solid solution represented by the formula

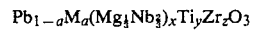

containing in the solution at least one oxide selected from the group A noted below and at least one oxide selected from the group B noted below, with the proviso that NiO or $Fe_2O_3$ is necessarily contained.
Group A: $La_2O_3$, $Bi_2O_3$ and $Nd_2O_3$;
Group B: NiO, $Fe_2O_3$, $SnO_2$ and $Ta_2O_5$.

The proposed ferroelectric ceramic material has a large piezoelectric strain constant d. The present invention is further directed to a ferroelectric ceramic which is a Perovskite solid solution comprising a solid solution represented by the formula

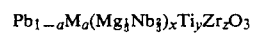

wherein M is Ba or Sr, $x+y+z$ is 1, a is from 0 to 0.10, x is from 0.05 to 0.70, y is from 0.25 to 0.50 and z is from 0.05 to 0.70, containing in solution at least one oxide selected from group A noted below and at least one oxide selected from group B noted below, with the proviso that NiO, $Fe_2O_3$ or $Ta_2O_5$ is necessarily contained, the solid solution further containing in the solid solution $MnO_2$.
Group A: $La_2O_3$, $Bi_2O_3$ and $Nd_2O_3$;
Group B: NiO, ZnO, $Fe_2O_3$, $SnO_2$ and $Ta_2O_5$.

13 Claims, No Drawings

FERROELECTRIC CERAMIC MATERIAL

FIELD OF THE INVENTION

The present invention relates to a ferroelectric ceramic material of $Pb(Mg_{\frac{1}{3}}Nb_{\frac{2}{3}})O_3$—$PbTiO_3$—$PbZrO_3$ series. More particularly, the present invention relates to a ferroelectric ceramic material of $Pb(Mg_{\frac{1}{3}}Nb_{\frac{2}{3}})O_3$—$PbTiO_3$—$PbZrO_3$ series having a large piezoelectric strain constant d and an excellent mechanical quality factor $Q_m$.

BACKGROUND OF THE INVENTION

Piezoelectric materials comprising ferroelectric ceramic materials have heretofore been used in piezoelectric filters, piezoelectric transducers, ultrasonic oscillators and piezoelectric buzzers. The most typical ferroelectric ceramic materials that have been used in such applications are solid solutions of $PbTiO_3$—$PbZrO_3$ series. Solid solutions of $Pb(Mg_{\frac{1}{3}}Nb_{\frac{2}{3}})O_3$—$PbTiO_3$—$PbZrO_3$ series (Japanese Patent Publication No. 42-9716) and those further containing $BaTiO_3$, $SrTiO_3$ and/or $CaTiO_3$ are also known as having improved piezoelectric characteristics.

On the other hand, the use of piezoelectric ceramic materials as an actuator has also been recently studied. In this case, it is necessary to transform electric energy to mechanical energy by the displacement of the piezoelectric ceramic material itself. Accordingly, piezoelectric ceramic materials having a large piezoelectric strain constant d are desired.

The piezoelectric strain constant d, is related to an electromechanical coupling factor k and a relative dielectric constant $\epsilon$, of a piezoelectric ceramic material, as follows:

$$d \propto k\sqrt{\epsilon}$$

and therefore, in order that the material has a large piezoelectric strain constant d, it must have a large electromechanical coupling factor k and/or a large relative dielectric constant $\epsilon$.

Further, in applications of piezoelectric ceramic materials such as a driving part of an actuator, for example, of an ultrasonic motor, where mechanical resonance of the material is utilized, it is desired that both the piezoelectric strain constant d and the mechanical quality factor $Q_m$ are large. When a piezoelectric ceramic material is used in an ultrasonic motor, if the mechanical quality factor $Q_m$ of the material is small, heat is generated due to high frequency driving involved, frequently leading to an undesirable reduction in spontaneous polarization of the material and changes in the piezoelectric strain constant of the material with time. Accordingly, it is essential that the mechanical quality factor $Q_m$ of a piezoelectric ceramic material be large, when the material is to be used in ultrasonic motors.

While the mechanical quality factor $Q_m$ of solid solutions of $PbTiO_3$—$PbZrO_3$ series or of $Pb(Mg_{\frac{1}{3}}Nb_{\frac{2}{3}})O_3$—$PbTiO_3$—$PbZrO_3$ series can be improved by incorporation of $MnO_2$ thereinto, there has been a problem in that the piezoelectric strain constant d of the material is drastically decreased as the amount of the $MnO_2$ added increases. Accordingly, base solid solutions prior to the addition of $MnO_2$ thereto should preferably have a sufficiently large piezoelectric strain constant d.

While various attempts have heretofore been made to add various oxides to solid solutions of $Pb(Mg_{\frac{1}{3}}Nb_{\frac{2}{3}})O_3$—$PbTiO_3$—$PbZrO_3$ series optionally containing $BaTiO_3$, $SrTiO_3$ and/or $CaTiO_3$ for the purpose of increasing the electromechanical coupling factor k and/or relative dielectric constant $\epsilon$, of the solid solutions, thereby increasing the piezoelectric strain constant d of the materials, the attainable level of the piezoelectric strain constant d has not necessarily been satisfactory.

For example, when a solid solution of $Pb(Mg_{\frac{1}{3}}Nb_{\frac{2}{3}})O_3$—$PbTiO_3$—$PbZrO_3$ series optionally containing $BaTiO_3$, $SrTiO_3$ and/or $CaTiO_3$ is incorporated with NiO, the piezoelectric strain constant d of the material is increased as the amount of NiO added is increased. However, when the amount of NiO added exceeds a certain limit, the piezoelectric strain constant d of the material is rather decreased. This is believed because whereas Ni ions preferentially enter the B sites of the Perovskite crystals represented by $ABO_3$, if the amount of NiO admixed with a Perovskite crystals exceeds the certain limit, ions in the A sites of the crystals becomes short and, as a consequence, a part of the NiO admixed can no longer enter the B sites of the Perovskite crystals.

It has now been found that if Perovskite crystals are incorporated with metal ions which enter the A sites of the crystals in addition to metal ions which enter the B sites of the crystal, such as Ni ions, ferroelectric ceramic materials having a larger piezoelectric strain constant d are obtained when compared with the case wherein the Perovskite crystals are incorporated with metal ions which enter only the B sites. It has also been found that if the so obtained ferroelectric ceramic solid solutions having a large piezoelectric strain constant d are further incorporated with $MnO_2$, ferroelectric ceramic materials having large piezoelectric strain constant d and mechanical quality factor $Q_m$ are obtained.

SUMMARY OF THE INVENTION

The invention is based on the above-mentioned findings, and accordingly an object of the invention is to provide ferroelectric ceramic materials having a large piezoelectric strain constant d and an excellent mechanical quality factor $Q_m$, and as a consequence, which are excellent in piezoelectric characteristics and are suitable for use in actuators.

A first ferroelectric ceramic material according to the invention is a Perovskite solid solution comprising a solid solution represented by the formula:

$$Pb_{1-a}M_a(Mg_{\frac{1}{3}}Nb_{\frac{2}{3}})_xTi_yZr_zO_3$$

wherein M is Ba or Sr, $x+y+z$ is 1, a is from 0 to 0.10, x is from 0.05 to 0.70, y is from 0.25 to 0.50 and z is from 0.05 to 0.70, containing in said solution at least one oxide selected from group A noted below and at least one oxide selected from group B noted below, with the provision that NiO or $Fe_2O_3$ is necessarily contained.

Group A: $La_2O_3$, $Bi_2O_3$ and $Nd_2O_3$;
Group B: NiO, $Fe_2O_3$, $SnO_2$ and $Ta_2O_5$.

The first ferroelectric ceramic material according to the invention in which metal ions of oxides selected from group A and metal ions of oxides selected from group B are incorporated in the A and the B sites of the Perovskite crystals, represented by $ABO_3$, respectively, has a greatly improved piezoelectric strain constant d when compared with known ferroelectric ceramic materials. Accordingly, the first ferroelectric ceramic material according to the invention exhibits excellent characteristics when used in applications such as an actuator.

The second ferroelectric ceramic material according to the invention is a Perovskite solid solution comprising a solid solution represented by the formula:

$$Pb_{1-a}M_a(Mg_{\frac{1}{3}}Nb_{\frac{2}{3}})_x Ti_y Zr_z O_3$$

wherein M is Ba or Sr, x+y+z is 1, a is from 0 to 0.10, x is from 0.05 to 0.70, y is from 0.25 to 0.50 and z is from 0.05 to 0.70, containing in said solution at least one oxide selected from group A noted below and at least one oxide selected from group B noted below, with the proviso that NiO, Fe$_2$O$_3$ or Ta$_2$O$_5$ is necessarily contained, said solid solution further containing in said, solid solution MnO$_2$.

Group A: La$_2$O$_3$, Bi$_2$O$_3$ and Nd$_2$O$_3$;
Group B: NiO, ZnO, Fe$_2$O$_3$, SnO$_2$ and Ta$_2$O$_5$.

The second ferroelectric ceramic material according to the invention in which metal ions of oxides selected from group A and metal ions of oxides selected from group B are incorporated in the A and the B sites of the Perovskite crystals, respectively, and in which MnO$_2$ is further incorporated, when compared with known ferroelectric ceramic materials, has an improved piezoelectric strain constant d, while retaining a comparable mechanical quality factor Qm. Accordingly, the second ferroelectric ceramic material according to the invention exhibits excellent characteristics when used in applications as a driving part of an actuator, such as an ultrasonic motor wherein mechanical resonance of the material is utilized.

DETAILED DESCRIPTION OF THE INVENTION

The ferroelectric ceramic materials according to the invention will now be described in detail.

The first ferroelectric ceramic material according to the invention is a Perovskite solid solution comprising a solid solution represented by the formula:

$$Pb_{1-a}M_a(Mg_{\frac{1}{3}}Nb_{\frac{2}{3}})_x Ti_y Zr_z O_3$$

wherein
M is Ba or Sr, x+y+z is 1,
a is from 0 to 0.10, preferably from 0.01 to 0.07,
x is from 0.05 to 0.70, preferably from 0.10 to 0.60,
y is from 0.25 to 0.50, preferably from 0.30 to 0.45, and
z is from 0.05 to 0.70, preferably from 0.10 to 0.60, containing in said solution at least one oxide selected from group A noted below and at least one oxide selected from group B noted below, with the proviso that NiO or Fe$_2$O$_3$ is necessarily contained.

Group A: La$_2$O$_3$, Bi$_2$O$_3$ and Nd$_2$O$_3$;
Group B: NiO, Fe$_2$O$_3$, SnO$_2$ and Ta$_2$O$_5$.

When the Perovskite crystals constituting the first ferroelectric ceramic material according to the invention are represented by ABO$_3$, a metal of at least one oxide selected from group A is present in the A sites of the crystals in the form of metal ions as noted below, and a metal of at least one oxide selected from group B is present in the B sites of the crystals in the form of metal ions as noted below, with the proviso that NiO or Fe$_2$O$_3$ is necessarily contained.

Group A: (La$^{3+}$, Bi$^{3+}$ or Nd$^{3+}$)
Group B: (Ni$^{2+}$, Fe$^{3+}$, Sn$^{4+}$ or Ta$^{5+}$).

In the solid solution represented by the formula:

$$Pb_{1-a}M_a(Mg_{\frac{1}{3}}Nb_{\frac{2}{3}})_x Ti_y Zr_z O_3$$

where M is Ba or Sr, metal ions of the group A are present preferably in an amount of from 0.5 to 5.0 atom equivalents based on 100 atom equivalents of the sum of Pb and M present in the solid solution. With such an amount of metal ions of group A, a particularly improved piezoelectric strain constant d can be achieved. The metal ions of group B are present in the Perovskite solid solution preferably in such an amount so that the relation:

$$0.5 \leq N \leq 5.0$$

is met, in which N is defined by the equation:

$$N = \sum_{j=1}^{j} n_{Bj} x_{Bj} / \sum_{i=1}^{i} n_{Ai} x_{Ai}$$

wherein $n_{Ai}$ and $n_{Bj}$ are valencies of metal ions of the oxides of groups A and B which are present in the solid solution, respectively, and $x_{Ai}$ and $x_{Bj}$ are atom equivalents of metal ions of the oxides of groups A and B which are present in the solid solution, respectively. With such an amount of metal ions of the group B, a particularly improved piezoelectric strain constant d can be achieved.

The second ferroelectric ceramic material according to the invention is a Perovskite solid solution comprising a solid solution represented by the formula:

$$Pb_{1-a}M_a(Mg_{\frac{1}{3}}Nb_{\frac{2}{3}})_x Ti_y Zr_z O_3$$

wherein
M is Ba or Sr, x+y+z is 1,
a is from 0 to 0.10, preferably from 0.01 to 0.07,
x is from 0.05 to 0.70, preferably from 0.10 to 0.60,
y is from 0.25 to 0.50, preferably from 0.30 to 0.45, and
z is from 0.05 to 0.70, preferably from 0.10 to 0.60, containing in said solution at least one oxide selected from group A noted below and at least one oxide selected from group B noted below, with the proviso that NiO, Fe$_2$O$_3$ or Ta$_2$O$_5$ is necessarily contained, said solid solution further containing in said solution MnO$_2$.

Group A: La$_2$O$_3$, Bi$_2$O$_3$ and Nd$_2$O$_3$;
Group B: NiO, ZnO, Fe$_2$O$_3$, SnO$_2$ and Ta$_2$O$_5$.

When the Perovskite crystals constituting the second ferroelectric ceramic material according to the invention are represented by ABO$_3$, a metal of at least one oxide selected from group A is present in the A sites of the crystals in the form of metal ions as noted below, and a metal of at least one oxide selected from group B is present in the B sites of the crystals in the form of metal ions as noted beloww, with the proviso that NiO, Fe$_2$O$_3$ or Ta$_2$O$_5$ is necessarily contained.

Group A: (La$^{3+}$, Bi$^{3+}$ or Nd$^{3+}$); and
Group B: (Ni$^{2+}$, Zn$^{2+}$, Fe$^{3+}$, Sn$^{4+}$ or Ta$^{5+}$).

In the solid solution represented by $$Pb_{1-a}M_a(Mg_{\frac{1}{3}}Nb_{\frac{2}{3}})_x Ti_y Zr_z O_3$$

where M is Ba or Sr, metal ions of group A are present preferably in an amount of from 0.5 to 5.0 atom equivalents based on 100 atom equivalents of the sum of Pb and M present in the solid solution. With such an amount of metal ions of group A, a particularly improved piezoelectric strain constant d can be achieved. The metal ions of the group B are present in the Perovskite solid solution in such an amount so that the relation:

$$0.5 \leq N \leq 5.0$$

is met, in which N is defined by the equation:

$$N = \sum_{j=1}^{i} n_{Bj} x_{Bj} / \sum_{i=1}^{i} n_{Ai} x_{Ai}$$

wherein $n_{Ai}$ and $n_{Bj}$ are valencies of metal ions of the oxides of groups A and B which are present in the solid solution, respectively, and $x_{Ai}$ and $x_{Bj}$ are atom equivalents of metal ions of the oxides of groups A and B which are present in the solid solution, respectively. With such an amount of metal ions of group B; a particularly improved piezoelectric strain constant d can be achieved.

The amount of $MnO_2$ contained in solution in the second ferroelectric ceramic material according to the invention is preferably from 0.1 to 2.0% by weight. With such an amount of $MnO_2$ contained, an improved mechanical quality factor $Q_m$ can be achieved, while retaining the piezoelectric strain constant d at a satisfactorily high level.

The ferroelectric ceramic materials according to the invention can be prepared by admixing of particulate metal compounds such as oxides and salts in such proportions which provide a desired composition when calcined, and calcining the admixture. Processes for preparing the starting particulate metal compounds are not particularly limited. They may be prepared by various known processes, including liquid phase processes such as precipitation, coprecipitation, alkoxide and sol-gel processes, and solid phase processes such as those based on decomposition of oxalates and blending of oxides. The admixture of particulate metal compounds in appropriate proportions may be precalcined at a temperature of from 800° to 100° C., pulverized in a ball mill, dried, pressed to a sheet under a pressure of from 500 to 1500 kg/cm², and finally calcined at a temperature of from 1000° to 1300° C., whereupon a desired ferroelectric ceramic material may be obtained.

EXAMPLES

While the invention will now be described by the following examples, it should be appreciated that the invention is in no way restricted to the examples.

The radial electromechanical coupling factor Kp, relative dielectric constant $\epsilon$, piezoelectric strain constant $d_{31}$, and mechanical quality factor Qm of ferroelectric ceramic materials were measured in accordance with Japan Electronic Material Manufactures Association Standard (EMAS).

EXAMPLES 1 TO 6, AND COMPARATIVE EXAMPLES 1 AND 2

PbO, $ZrO_2$, $TiO_2$, $MgCO_3$, $Nb_2O_5$, $SrCO_3$, $La_2O_3$, NiO and $SnO_2$ were weighed in proportions which provide each composition as indicated in Table 1, pulverized and admixed in a ball mill. The pulverized admixture was pre-calcined at a temperature of from 800° to 1000° C. for a period of from 1 to 2 hours, pulverized in a ball mill and dried. The mixture was then pressed to a disc having a diameter of 25 mm under a pressure of about 1000 kg/cm² and finally calcined at a temperature of from 1050° to 1250° C. for a period of from 1 to 2 hours.

The calcined disc so prepared was polished to a thickness of 0.5 mm, coated with silver paste on both surfaces and baked. It was then polarized by application of a DC electric field of from 20 to 40 KV/cm in a silicone oil and thereafter aged for 12 hours. The specimen so prepared was tested for various electric properties.

The results are shown in Table 1. In Table 1, a, x, y and z represent coefficients appearing in the formula:

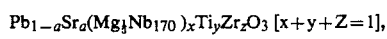
$$Pb_{1-a}Sr_a(Mg_{\frac{1}{3}}Nb_{\frac{1}{70}})_x Ti_y Zr_z O_3 \; [x+y+Z=1],$$

p, q and r represent atom equivalents of respective metal ions indicated in the same table based on 100 atom equivalents of the sum of Pb and Sr, and N is a value defined by the equation:

$$N = \sum_{j=1}^{i} n_{Bj} x_{Bj} / \sum_{i=1}^{i} n_{Ai} x_{Ai}$$

wherein $n_{Ai}$ and $n_{Bj}$ are valencies of metal ions of the groups A and B, respectively, and $x_{Ai}$ and $x_{Bj}$ are atom equivalents of metal ions of the groups A and B, respectively.

TABLE 1

| | Composition | | | | Group A Metal Ion | Group B Metal Ion | | | Electric Properties | | |
|---|---|---|---|---|---|---|---|---|---|---|---|
| | a | x | y | z | p | q | r | N | ε | Kp % | $d_{31}$ × $10^{-12}$ m/V |
| Example 1 | 0.05 | 0.375 | 0.375 | 0.250 | $La^{3+}$ 2.0 | $Ni^{2+}$ 2.0 | $Sn^{4+}$ 2.0 | 2.0 | 6640 | 64 | 376 |
| Example 2 | 0.05 | 0.375 | 0.375 | 0.250 | $La^{3+}$ 2.0 | $Ni^{2+}$ 2.0 | — | 0.67 | 6220 | 57 | 298 |
| Example 3 | 0.05 | 0.375 | 0.375 | 0.250 | $La^{3+}$ 1.0 | $Ni^{2+}$ 1.0 | $Sn^{4+}$ 1.0 | 2.0 | 5960 | 65 | 351 |
| Example 4 | 0.05 | 0.375 | 0.375 | 0.250 | $La^{3+}$ 1.0 | $Ni^{2+}$ 0.5 | $Sn^{4+}$ 1.0 | 1.67 | 5060 | 67 | 336 |
| Example 5 | 0.05 | 0.375 | 0.375 | 0.250 | $La^{3+}$ 1.0 | $Ni^{2+}$ 2.0 | $Sn^{4+}$ 2.0 | 4.0 | 4430 | 66 | 303 |
| Example 6 | 0.05 | 0.375 | 0.375 | 0.250 | $La^{3+}$ 0.5 | $Ni^{2+}$ 0.5 | $Sn^{4+}$ 0.5 | 2.0 | 4530 | 64 | 300 |
| Comp. Ex 1 | 0.05 | 0.375 | 0.375 | 0.250 | — | — | — | — | 4100 | 61 | 267 |
| Comp. Ex 2 | 0.05 | 0.375 | 0.375 | 0.250 | — | $Ni^{2+}$ 2.0 | — | — | 4460 | 61 | 277 |

It is revealed from Table 1 that when compared with the ferroelectric ceramic material [I] of Comparative Example 1 having a composition of the formula:

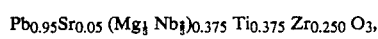
$$Pb_{0.95}Sr_{0.05} (Mg_{\frac{1}{3}} Nb_{\frac{2}{3}})_{0.375} Ti_{0.375} Zr_{0.250} O_3,$$

and with the ferroelectric ceramic material of Comparative Example 2 comprising the ferroelectric ceramic material [I] having incorporated with only $Ni^{2+}$ in the B sites, the ferroelectric ceramic materials of Examples 1 to 6 according to the invention, which comprise the ferroelectric ceramic material [I] having incorporated with $La^{3+}$ in the A sites and with $Ni^{2+}$, or $Ni^{2+}$ and $Sn^{4+}$ in the B sites, do have a larger piezoelectric strain constant $d_{31}$.

EXAMPLES 7 TO 14

PbO, ZrO$_2$, TiO$_2$, MgCO$_3$, Nb$_2$O$_5$, SrCO$_3$, at least one oxide selected from the group A consisting of La$_2$O$_3$, Bi$_2$O$_3$ and Nd$_2$O$_3$, and at least one oxide selected from the group B consisting of NiO, Fe$_2$O$_3$, SnO$_2$ and Ta$_2$O$_5$, were weighed in proportions which provide each composition as indicated in Table 2, pulverized and admixed in a ball mill. The pulverized admixture was processed as in Example 1 to prepare a ferroelectric ceramic material, which was tested for electric properties.

The results are shown in Table 2.

EXAMPLE 18 AND COMPARATIVE EXAMPLE 6

Ferroelectric ceramic materials were prepared and tested in the same manner as described in Example 1 and Comparative Example 1, except that the SrCO$_3$ was replaced with the equimolar amount of BaCO$_3$.

The results are shown in Table 3.

TABLE 3

| | Composition | | | | | | | | Electric Properties | | |
|---|---|---|---|---|---|---|---|---|---|---|---|
| | | | | | Group A Metal Ion | Group B Metal Ion | | | | Kp | d$_{31}$ |
| | a | x | y | z | p | q | r | N | ε | % | × 10$^{-12}$ m/V |
| Example 15 | 0.05 | 0.500 | 0.370 | 0.130 | La$^{3+}$ 2.0 | Ni$^{2+}$ 2.0 | Sn$^{4+}$ 2.0 | 2.0 | 6800 | 60 | 346 |
| Comp. Ex 3 | 0.05 | 0.500 | 0.370 | 0.130 | — | — | — | — | 4690 | 56 | 262 |
| Example 16 | 0.05 | 0.130 | 0.430 | 0.440 | La$^{3+}$ 2.0 | Ni$^{2+}$ 2.0 | Sn$^{4+}$ 2.0 | 2.0 | 6220 | 62 | 340 |
| Comp. Ex 4 | 0.05 | 0.130 | 0.430 | 0.440 | — | — | — | — | 3870 | 59 | 250 |
| Example 17 | 0.03 | 0.375 | 0.375 | 0.250 | La$^{3+}$ 3.0 | Ni$^{2+}$ 1.5 | Sn$^{4+}$ 3.0 | 1.67 | 5930 | 63 | 341 |
| Comp. Ex 5 | 0.03 | 0.375 | 0.375 | 0.250 | — | — | — | — | 3480 | 59 | 240 |
| Example 18 | 0.05 | 0.375 | 0.375 | 0.250 | La$^{3+}$ 2.0 | Ni$^{2+}$ 2.0 | Sn$^{4+}$ 2.0 | 2.0 | 6410 | 64 | 353 |
| Comp. Ex 6 | 0.05 | 0.375 | 0.375 | 0.250 | — | — | — | — | 3830 | 62 | 259 |

EXAMPLES 19 TO 21, AND COMPARATIVE EXAMPLES 7 AND 8

PbO, ZrO$_2$, TiO$_2$, MgCO$_3$, Nb$_2$O$_5$, SrCO$_3$, La$_2$O$_3$, NiO, SnO$_2$ and MnO$_2$ were weighed in proportions which provide each composition as indicated in Table 4, pulverized and admixed in a ball mill. The pulverized admixture was processed as in Example 1 to prepare a ferroelectric ceramic material, which was tested for various electric properties.

The results are shown in Table 4.

TABLE 2

| | Composition | | | | | | | | Electric Properties | | |
|---|---|---|---|---|---|---|---|---|---|---|---|
| | | | | | Group A Metal Ion | Group B Metal Ion | | | | Kp | d$_{31}$ |
| | a | x | y | z | p | q | r | N | ε | % | × 10$^{-12}$ m/V |
| Example 7 | 0.05 | 0.375 | 0.375 | 0.250 | La$^{3+}$ 2.0 | Ni$^{2+}$ 1.71 | Ta$^{5+}$ 1.71 | 2.0 | 7300 | 66 | 394 |
| Example 8 | 0.05 | 0.375 | 0.375 | 0.250 | La$^{3+}$ 1.0 | Ni$^{2+}$ 0.86 | Ta$^{5+}$ 0.86 | 2.0 | 5630 | 65 | 339 |
| Example 9 | 0.05 | 0.375 | 0.375 | 0.250 | Bi$^{3+}$ 2.0 | Ni$^{2+}$ 2.0 | Sn$^{4+}$ 2.0 | 2.0 | 5720 | 61 | 313 |
| Example 10 | 0.05 | 0.375 | 0.375 | 0.250 | Bi$^{3+}$ 2.0 | Fe$^{3+}$ 1.33 | Sn$^{4+}$ 2.0 | 2.0 | 5660 | 62 | 319 |
| Example 11 | 0.05 | 0.375 | 0.375 | 0.250 | Bi$^{3+}$ 2.0 | Ni$^{2+}$ 1.71 | Ta$^{5+}$ 1.71 | 2.0 | 6170 | 62 | 327 |
| Example 12 | 0.05 | 0.375 | 0.375 | 0.250 | Nd$^{3+}$ 2.0 | Ni$^{2+}$ 2.0 | Sn$^{4+}$ 2.0 | 2.0 | 6790 | 62 | 346 |
| Example 13 | 0.05 | 0.375 | 0.375 | 0.250 | Nd$^{3+}$ 1.0 | Ni$^{2+}$ 1.0 | Sn$^{4+}$ 1.0 | 2.0 | 5800 | 62 | 327 |
| Example 14 | 0.05 | 0.375 | 0.375 | 0.250 | Nd$^{3+}$ 2.0 | Ni$^{2+}$ 1.71 | Ta$^{5+}$ 1.71 | 2.0 | 6400 | 57 | 296 |

Table 2 also reveals that joint inclusion of metal ions of the groups A and B into the ferroelectric ceramic material [I] improves the piezoelectric strain constant d$_{31}$.

EXAMPLES 15 TO 17, AND COMPARATIVE EXAMPLES 3 TO 5

TABLE 4

| | Composition | | | | | | | | | Electric Properties | | | |
|---|---|---|---|---|---|---|---|---|---|---|---|---|---|
| | | | | | Group A Metal Ion | Group B Metal Ion | | | MnO$_2$ | | Kp | d$_{31}$ | |
| | a | x | y | z | p | q | r | N | (wt %) | ε | % | × 10$^{-12}$ m/V | Qm |
| Example 19 | 0.05 | 0.375 | 0.375 | 0.250 | La$^{3+}$ 2.0 | Ni$^{2+}$ 2.0 | Sn$^{4+}$ 2.0 | 2.0 | 0.2 | 5380 | 59 | 255 | 660 |
| Example 20 | 0.05 | 0.375 | 0.375 | 0.250 | La$^{3+}$ 2.0 | Ni$^{2+}$ 2.0 | Sn$^{4+}$ 2.0 | 2.0 | 0.5 | 2920 | 57 | 181 | 1130 |
| Example 21 | 0.05 | 0.375 | 0.375 | 0.250 | La$^{3+}$ 2.0 | Ni$^{2+}$ 2.0 | Sn$^{4+}$ 2.0 | 2.0 | 1.0 | 1890 | 53 | 140 | 1210 |
| Comp. Ex 7 | 0.05 | 0.375 | 0.375 | 0.250 | — | — | — | — | 0.5 | 1740 | 53 | 129 | 970 |
| Comp. Ex 8 | 0.05 | 0.375 | 0.375 | 0.250 | — | Ni$^{2+}$ 2.0 | — | — | 0.5 | 1800 | 52 | 130 | 1010 |

Each of the ferroelectric ceramic materials of the formula:

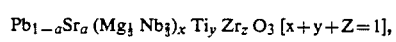

Pb$_{1-a}$Sr$_a$ (Mg$_{\frac{1}{3}}$ Nb$_{\frac{2}{3}}$)$_x$ Ti$_y$ Zr$_z$ O$_3$ [x+y+Z=1], wherein the coefficients a, x, y and z are different from those of the ferroelectric ceramic material used in Examples 1 to 14, as indicated in Table 3, with (Examples 15 to 17) or without (Comparative Examples 3 to 5) La$^{3+}$, Ni$^{2+}$ and Sn$^{4+}$ in amounts indicated in Table 3 incorporated therein, was prepared and tested for electric properties in the manner as described in Example 1.

The results are shown in Table 3.

Table 4 reveals that in the ferroelectric ceramic material [I] having a composition of the formula:

Pb$_{0.95}$ Sr$_{0.5}$ (Mg$_{\frac{1}{3}}$ Nb$_{\frac{2}{3}}$)$_{0.375}$ Ti$_{0.375}$ Zr$_{0.250}$ O$_3$, having incorporated with La$^{3+}$ in the A sites and with Ni$^{2+}$ and Sn$^{4+}$ in the B sites, as the amount of MnO$_2$ incorporated is increased, the mechanical quality factor Q$_m$ of the material is increased while the piezoelectric strain constant d$_{31}$ of the material is decreased. It has been confirmed, however, that when compared with the ferroelectric ceramic material [I] with or without Ni$^{2+}$, which enters the B Sites of the material, having incorporated with MnO$_2$, according to Comparative Examples 7 and 8, the ferroelectric ceramic materials according to the invention whose mechanical quality factor Q$_m$ have been increased to a comparable level of that of the materials of Comparative Examples 7 and 8 by addition of MnO$_2$, still have a larger piezoelectric strain constant d$_{31}$.

EXAMPLES 22 TO 24

PbO, ZrO$_2$, TiO$_2$, MgCO$_3$, Nb$_2$O$_5$, SrCO$_3$, at least one oxide selected from the group A consisting of La$_2$O$_3$, Bi$_2$O$_3$ and Nd$_2$O$_3$, at least one oxide selected from the group B consisting of NiO, ZnO, Fe$_2$O$_3$, SnO$_2$ and Ta$_2$O$_5$, with the proviso that NiO, Fe$_2$O$_3$ or Ta$_2$O$_5$ was necessarily used, and MnO$_2$ were weighed in proportions which provide each composition as indicated in Table 5, pulverized and admixed in a ball mill. The pulverized admixture was processed as in Example 1 to prepare a ferroelectric ceramic material, which was tested for electric properties.

The results are shown in Table 5.

TABLE 5

| | Composition | | | | | | | | | Electric Properties | | | |
|---|---|---|---|---|---|---|---|---|---|---|---|---|---|
| | | | | | Group A Metal Ion | Group B Metal Ion | | | MnO$_2$ | | Kp | d$_{31}$ | |
| | a | x | y | z | p | q | r | N | (wt %) | ε | % | × 10$^{-12}$ m/V | Qm |
| Example 22 | 0.05 | 0.375 | 0.375 | 0.250 | La$^{3+}$ 2.0 | Ni$^{2+}$ 1.71 | Ta$^{5+}$ 1.71 | 2.0 | 0.5 | 3230 | 55 | 184 | 1070 |
| Example 23 | 0.05 | 0.375 | 0.375 | 0.250 | La$^{3+}$ 2.0 | Zn$^{2+}$ 1.71 | Ta$^{5+}$ 1.71 | 2.0 | 0.5 | 2540 | 54 | 163 | 1140 |
| Example 24 | 0.05 | 0.375 | 0.375 | 0.250 | Bi$^{3+}$ 2.0 | Ni$^{2+}$ 1.71 | Ta$^{5+}$ 1.71 | 2.0 | 0.5 | 2500 | 54 | 164 | 1100 |
| Example 25 | 0.05 | 0.375 | 0.375 | 0.250 | Bi$^{2+}$ 2.0 | Fe$^{3+}$ 1.33 | Sn$^{4+}$ 2.0 | 2.0 | 0.5 | 2300 | 55 | 157 | 1030 |
| Example 26 | 0.05 | 0.375 | 0.375 | 0.250 | Bi$^{3+}$ 2.0 | Sn$^{4+}$ 1.33 | Ta$^{5+}$ 1.33 | 2.0 | 0.5 | 2690 | 53 | 161 | 1190 |
| Example 27 | 0.05 | 0.375 | 0.375 | 0.250 | Nd$^{2+}$ 2.0 | Ni$^{2+}$ 2.0 | Sn$^{4+}$ 2.0 | 2.0 | 0.5 | 2760 | 55 | 177 | 980 |
| Example 28 | 0.05 | 0.375 | 0.375 | 0.250 | Nd$^{2+}$ 2.0 | Zn$^{2+}$ 1.71 | Ta$^{5+}$ 1.71 | 2.0 | 0.5 | 2410 | 52 | 154 | 990 |

It can be confirmed from Table 5 that the ferroelectric ceramic materials [I] having incorporated with metal ions of the groups A and B together with MnO$_2$ are materials having an increased mechanical quality factor Q$_m$ and a large piezoelectric strain constant d$_{31}$.

EXAMPLES 29 TO 31, and COMPARATIVE EXAMPLES 9 TO 11

Each of the ferroelectric ceramic materials of the formula:

$$Pb_{1-a}Sr_a (Mg_{\frac{1}{3}} Nb_{\frac{2}{3}})_x Ti_y Zr_z O_3 \ [x+y+z=1],$$

wherein the coefficients a, x, y and z are different from those of the ferroelectric ceramic material used in Examples 19 to 28, as indicated in Table 6, with (Examples 29 to 31) or without (Comparative Examples 9 to 11) La$^{3+}$, Ni$^{2+}$ and Sn$^{4+}$ in amounts indicated in Table 6 incorporated therein and containing 0.5% by weight of MnO$_2$, was prepared and tested for electric properties in the manner as described in Example 1.

The results are shown in Table 6.

EXAMPLE 32 AND COMPARATIVE EXAMPLE 12

Ferroelectric ceramic materials were prepared and tested in the same manner as described in Example 20 and Comparative Example 7, except that the SrCO$_3$ was replaced with the equimolar amount of BaCO$_3$.

The results are shown in Table 6.

TABLE 6

| | Composition | | | | | | | | | Electric Properties | | | |
|---|---|---|---|---|---|---|---|---|---|---|---|---|---|
| | | | | | Group A Metal Ion | Group B Metal Ion | | | MnO$_2$ | | Kp | d$_{31}$ | |
| | a | x | y | z | p | q | r | N | (wt %) | ε | % | × 10$^{-12}$ m/V | Qm |
| Example 29 | 0.05 | 0.500 | 0.370 | 0.130 | La$^{3+}$ 2.0 | Ni$^{2+}$ 2.0 | Sn$^{4+}$ 2.0 | 2.0 | 0.5 | 2830 | 53 | 169 | 1230 |
| Comp. Ex 9 | 0.05 | 0.500 | 0.370 | 0.130 | — | — | — | — | 0.5 | 1870 | 48 | 121 | 1180 |
| Example 30 | 0.05 | 0.130 | 0.430 | 0.440 | La$^{3+}$ 2.0 | Ni$^{2+}$ 2.0 | Sn$^{4+}$ 2.0 | 2.0 | 0.5 | 2320 | 52 | 152 | 1050 |
| Comp. Ex 10 | 0.05 | 0.130 | 0.430 | 0.440 | — | — | — | — | 0.5 | 1540 | 48 | 109 | 930 |
| Example 31 | 0.03 | 0.375 | 0.375 | 0.250 | La$^{3+}$ 3.0 | Ni$^{2+}$ 1.5 | Sn$^{4+}$ 3.0 | 1.67 | 0.5 | 1980 | 55 | 146 | 970 |
| Comp. Ex 11 | 0.03 | 0.375 | 0.375 | 0.250 | — | — | — | — | 0.5 | 1370 | 50 | 110 | 930 |
| Example 32 | 0.05 | 0.375 | 0.375 | 0.250 | La$^{3+}$ 2.0 | Ni$^{2+}$ 2.0 | Sn$^{4+}$ 2.0 | 2.0 | 0.5 | 2520 | 55 | 167 | 1270 |
| Comp. Ex 12 | 0.05 | 0.375 | 0.375 | 0.250 | — | — | — | — | 0.5 | 1660 | 48 | 119 | 1010 |

What is claimed is:

1. A ferroelectric ceramic material which is a Pervoskite solid solution, which comprises a solid solution represented by the formula:

$$Pb_{1-a}M_a (Mg_{\frac{1}{3}}Nb_{\frac{2}{3}})_x Ti_y Zr_z O_3$$

wherein M is Ba or Sr, x+y+z is 1, a is from 0 to 0.10, x is from 0.05 to 0.70, y is from 0.25 to 0.50 and z is from 0.05 to 0.70, containing in said solution at least one oxide selected from group A noted below and at least one oxide selected from group B noted below, with the proviso that NiO or Fe$_2$O$_3$ is necessarily contained:

Group A: La$_2$O$_3$, Bi$_2$O$_3$ and Nd$_2$O$_3$;
Group B: NiO, Fe$_2$O$_3$, SnO$_2$ and Ta$_2$O$_5$ wherein the metal ions of the oxide selected from the group B are present in the Perovskite solid solution in such an amount so that the relation:

$$0.5 \leq N \leq 5.0$$

is met, in which N is defined by the equation:

$$N = \sum_{j=1}^{j} n_{Bj} x_{Bj} / \sum_{i=1}^{i} n_{Ai} x_{Ai}$$

wherein n$_{Ai}$ and n$_{Bj}$ are valencies of metal ions of the oxides of groups A and B which are present in the solid solution, respectively, and x$_{Ai}$ and x$_{Bj}$ are atom equivalents of metal ions of the oxides of groups A and B which are present in the solid solution, respectively.

2. The ferroelectric ceramic material of claim 1 wherein a metal of at least one oxide selected from group A is present in the Perovskite solid solution in the form of La$^{3+}$, Bi$^{3+}$ or Nd$^{3+}$.

3. The ferroelectric ceramic material with of claim 2 wherein the metal ions of the oxide selected from group A are present in the Perovskite solid solution in an amount of from 0.5 to 5.0 atom equivalents based on 100 atom equivalents of the sum of Pb and M present in the Perovskite solid solution.

4. The ferroelectric ceramic material in of claim 1 wherein a metal of the oxide selected from the group B is present in the Pervoskite solid solution in the form of $Ni^{2+}$, $Fe^{3+}$, $Sn^{4+}$ or $Ta^{5+}$.

5. The ferroelectric ceramic material of claim 1, wherein metal ions of oxides of group A and metal ions of oxides of group B are incorporated into A sites and B sites of an $ABO_3$ type Pervoskite crystal, respectively.

6. A ferroelectric ceramic material which is a Pervoskite solid solution, which comprises a solid solution represented by the formula:

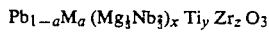

$$Pb_{1-a}M_a(Mg_{\frac{1}{3}}Nb_{\frac{2}{3}})_x Ti_y Zr_z O_3$$

wherein M is Ba or Sr, $x+y+z$ is 1, a is from 0 to 0.10, x is from 0.05 to 0.70, y is from 0.25 to 0.50 and z is from 0.05 to 0.70, containing in said solution at least one oxide selected from group A noted below and at least one oxide selected from group B noted below, with the proviso that NiO, $Fe_2O_3$ or $TaO_5$ is necessarily contained, said solid solution further containing $MnO_2$:

Group A: $La_2O_3$, $Bi_2O_3$ and $Nd_2O_3$;
Group B: NiO, $Fe_2O_3$, $SnO_2$ and $Ta_2O_5$ wherein the metal ion of the oxide selected from group B is present in the Pervoskite solid solution in such an amount so that the relation:

$$0.5 \leq N \leq 5.0$$

is met, in which N is defined by the equation:

$$N = \sum_{j=1}^{i} n_{Bj} x_{Bj} / \sum_{i=1}^{i} n_{Ai} x_{Ai}$$

wherein $n_{Ai}$ and $n_{Bj}$ are valencies of metal ions of the oxides of groups A and B which are present in the solid solution, respectively, and $x_{Ai}$ and $x_{Bj}$ are atom equivalents of metal ions of the oxides of groups A and B which are present in the solid solution, respectively.

7. The ferroelectric ceramic material of claim 6 wherein a metal of the oxide selected from group A is present in the Perovskite solid solution in the form of $La^{3+}$, $Bi^{3+}$ or $Nd^{3+}$.

8. The ferroelectric ceramic material of claim 7 wherein the metal ion of the oxide selected from group A is present in the Perovskite solid solution in an amount of from 0.5 to 5.0 atom equivalents based on 100 atom equivalents of the sum of Pb and M present in the Perovskite solid solution.

9. The ferroelectric ceramic material of claim 6 wherein a metal of the oxide selected from the group B is present in the Perovskite solid solution in form of $Ni^{2+}$, $Zn^{2+}$, $Fe^{3+}$, $Sn^{4+}$ or $Ta^{5+}$.

10. The ferroelectric ceramic material in of claim 6 wherein the $MnO_2$ is present in the solid solution in an amount of from 0.1 to 2.0% by weight.

11. The ferroelectric ceramic material of claim 6, wherein metal ions of oxides of group A and metal ions of oxides of group B are incorporated into A sites and B sites of an $ABO_3$ type Perovskite crystal, respectively.

12. The ferroelectric ceramic material of claim 6, wherein
   a is from 0.01 to 0.07,
   x is from 0.10 to 0.60,
   y is from 0.30 to 0.45, and
   z is from 0.10 to 0.60.

13. The ferroelectric ceramic material of claim 6, wherein
   a is from 0.01 to 0.07,
   x is from 0.10 to 0.60,
   y is from 0.30 to 0.45, and
   z is from 0.10 to 0.60.

* * * * *

UNITED STATES PATENT AND TRADEMARK OFFICE
CERTIFICATE OF CORRECTION

PATENT NO. : 4,940,681
DATED : July 10, 1990
INVENTOR(S) : Yoshihisa USHIDA et al It is certified that error appears in the above-identified patent and that said Letters Patent is hereby corrected as shown below:

Column 3, line 68
  change "$Ni^{2°}$" to --$Ni^{2+}$--

Column 4, line 57
  change "beloww" to --below--

Column 5, line 55
  change "100°C" to --1000°C--

Column 6, line 26
  change "$Pb_{1-a}Sr_a(Mg_{1/3}Nb_{1}70)_xTi_yZr_zO_3[x+y+Z=1]$"
  to --$Pb_{1-a}Sr_a(Mg_{1/3}Nb_{2/3})_xTi_yZr_zO_3(x+y+z=1)$--

Column 7, line 59
  change "[x+y+Z=1]" to --[x+y+z=1]--

Column 8, line 59
  change "$(Mg_{1/3}Nb_{2/3})0.375$" to --$(Mg_{1/3}Nb_{2/3})0.375$--

Column 9, line 59
  change "[x+y+Z=1]" to --[x+y+z=1]--

Column 10, lines 23-24
  change "Pervoskite" to --Perovskite--

UNITED STATES PATENT AND TRADEMARK OFFICE
CERTIFICATE OF CORRECTION

PATENT NO. : 4,940,681

DATED : July 10, 1990

INVENTOR(S) : Yoshihisa USHIDA et al

It is certified that error appears in the above-identified patent and that said Letters Patent is hereby corrected as shown below:

Column 11, lines 19-20
   change "Pervoskite" to --Perovskite--

Column 11, line 37
   change "Pervoskite" to --Perovskite--

Signed and Sealed this

Seventh Day of June, 1994

Attest:

BRUCE LEHMAN

Attesting Officer      Commissioner of Patents and Trademarks